METHOD OF BONDING MATERIALS

Filed Sept. 14, 1959

JERROLD COHEN
INVENTOR.

BY Spensley and Horn

ATTORNEYS

United States Patent Office 3,091,849

Patented June 4, 1963

3,091,849

METHOD OF BONDING MATERIALS

Jerrold Cohen, Costa Mesa, Calif., assignor to Pacific Semiconductors, Inc., Culver City, Calif., a corporation of Delaware Filed Sept. 14, 1959, Ser. No. 839,807
3 Claims. (Cl. 29—472.9)

This invention relates to the bonding of materials and more particularly to a method for bonding electrodes to silicon.

When bonding materials together, in order to effect a satisfactory bond, it is preferable to have the contacting surfaces of the materials clean and free from impurities, undesired coatings and corrosion. In some instances, any more than the slightest degree of contamination of the contact surface or surfaces of the materials to be bonded will drastically reduce the effectiveness of the bonded connection for the purposes intended.

In the semiconductor art the provision of mechanically rugged contacts having low electrical resistance is often of extreme importance. Silicon which is the prime building block of modern semiconductor devices presents a particularly difficult problem in this regard. Typically, in the packaging of such a device, one end of a thin wire is bonded to the surface of a silicon body while the opposite end of the wire is welded to an electrical contact provided within the package. As silicon has an especially strong affinity for oxygen an oxide coating quickly forms upon the surfaces of pure silicon which is exposed to the ambient. If a metallic electrical conductor such as gold is "thermo-compression" bonded to an oxide coated surface of a silicon body, both the mechanical strength and the electrical conductivity of the bonded joint will be appreciably lower than would be the case had the bond been made to a clean oxide free surface. The term "thermo-compression bonding" is used herein as discussed in an article entitled "Electrical Contact With Thermo-Compression Bonds" by H. Christensen, pages 127–130 of the April, 1958 issue of Bell Laboratories Record. In practice it has been found that even if the bonding operation to a silicon semiconductor device is performed as soon as possible after the removal of the oxide from the silicon surface, the relatively short time of exposure to the ambient before the bonding operation is completed is sufficient to allow formation of a new oxide.

This results in a significant decrease in the average electrical conductivity of the resulting thermo-compression bonded joint; additionally because of the relatively small area of contact between the wire and the silicon surface, the accompanying reduction in bond strength adversely affects the reliability of the completed semiconductor device.

Several prior art methods for providing strong electrical contact to silicon by the thermo-compression bonding technique, have been practiced. One of the prior art methods involves the thermo-compression bonding of a gold wire to silicon, for example, in air. Such a bond is inherently weak as evidenced by the fact that upon vibration or pull the wire separates from the silicon surface without tearing an appreciable amount of silicon.

The second prior art method involves the thermo-compression bonding in an inert atmosphere. Such bonds, while stronger than those produced in air at room temperature, are still weak. Thermo-compression in air at high temperatures generally results in a strong bond but probably leave dislocations in the silicon. At high temperatures impurities such as iron which may harm the device characteristics tend to appreciably diffuse into the silicon during the time the temperature is raised. In addition, the effectiveness of such a method is still dependent upon minimizing exposure of the silicon surfaces to air while sealing the semiconductor body from an oxide removal bath or apparatus to the inert atmosphere enclosure.

The present invention overcomes all the difficulties attendant in the hereinabove described prior art methods while providing a thermo-compression bond having excellent electrical characteristics and strong mechanical strength.

It is therefore an object of the present invention to provide an improved method for bonding materials together in the absence of undesired contamination at the contact area.

It is a further object of the present invention to provide a convenient method for bonding materials together without exposing the contact area therebetween to the ambient.

It is still a further object of the present invention to provide an improved method of bonding metals to a semiconductor material resulting in a strong bonded connection and high electrical conductivity therebetween.

It is yet another object of the present invention to provide a method of bonding a fine metal wire to the surface of a silicon semiconductor crystal body.

Still another object of the present invention is to provide an improved method of bonding a fine gold wire to the surface of a silicon semiconductor crystal body.

In accordance with the presently preferred method of the present invention hydrogen fluoride is introduced into a substantially closed system in vapor phase. The hydrogen fluoride gas is transported by either an inert carrier gas such as argon, neon, krypton, or helium, or by hydrogen which is a reducing gas. This is accomplished by bubbling the carrier gas through a water solution of hydrofluoric acid in a closed container. Thus, the gas mixture will drive any oxygen out of the vicinity where the bond is to take place. This gas mixture is passed over the silicon body upon which the gold wire, to form the contact, has previously been disposed. The hydrofluoric acid removes any oxide of silicon which exists on the surface of the silicon body, to which contact is to be made. The gold wire lying on the silicon body is then pressed, while the gas is flowing over the silicon body, with a weighted knife edge to the silicon surface and heat is then applied to the silicon by means of a strip heater. A pressure of approximately $1 \times 10^9$ dynes per square centimeter maintained for approximately three minutes at a temperature of about 340° C. has been found to result in a particularly satisfactory bond.

The novel features which are believed to be characteristic of the present invention, both as to its organization and method of operation, together with further objects and advantages thereof will be better understood from the following description considered in connection with the accompanying drawing.

It is to be expressly understood, however, that the drawing is for the purpose of illustration and example only, and it is not intended as a definition of the limits of the invention.

For the purposes of illustration and clarity of explanation, the present invention will be discussed in connection with the bonding of fine gold leads to a silicon semiconductor crystal body and more particularly to a transistor. It will, of course, be understood that other leads or wires or metal ribbons or the like or other conducting metals may also be used in accordance with the present invention.

Figure 1:
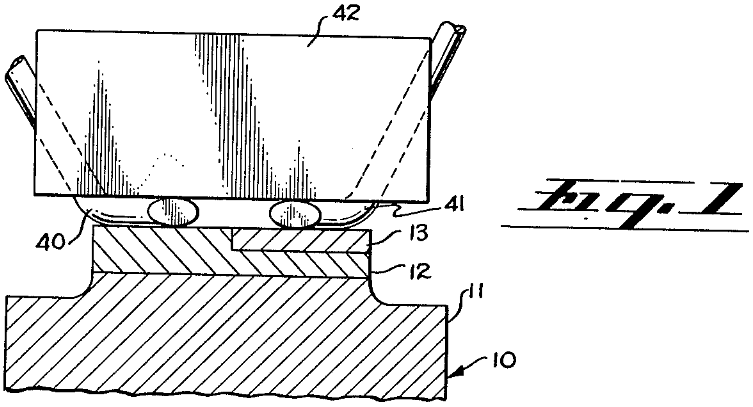
FIGURE 1 is an enlarged cross-sectional view of a transistor to which attachment of wire electrodes in accordance with the present invention is to be carried out.

Referring now to the drawing, there is shown in FIGURE 1 a greatly enlarged view, partly in section, of a "mesa" type transistor 10 which includes a collector region 11 and base region 12 and an emitter region 13. A plan view of the transistor 10 showing it mounted upon a molybdenum tab which is in turn mounted on a gold plated metal header 30 may be seen in FIGURE 2. The header 30 consists of a cylindrical body portion through which extend insulated bushings 31, 32 and 33. Rigidly and concentrically mounted within the insulated bushings 31, 32 and 33 are gold plated metallic terminal posts 34, 35 and 36 respectively which protrude from both ends of the insulated bushings. At the stage of production shown in FIGURE 1 the transistor assembly 10 is shown preparatory to the bonding thereto of electrical connections to the base region 12 and the emitter region 13. These electrical connectors are shown to be fine gold wires or leads 40 and 41 respectively. Disposed atop the leads 40 and 41 is a sapphire knife edge 42. The entire assembly of FIGURE 1 is shown on a slightly different scale rotated through an angle of 90° in FIGURE 3. Therein the transistor 10, the leads 40 and 41 and the knife edge 42 are all shown enclosed within a chamber defined by a generally hollow cylinder comprising a sidewall 50, which may be made of quartz or the like, into which has been press-fit a mateable steel roof section 51. The cylinder rests upon a flat plate 49. The roof 51 defines a central opening in the form of a slot 52 through which the knife edge 42 is loosely slidable. Off to one side of the central slot 52 there is provided an opening 55 through the thickness dimension of the roof 51 in order to admit gas inlet pipe 56. The roof 51 has a thickness dimension upon both sides of the slot 52 which is appreciably greater than that surrounding the supporting walls 57 and 58 which surround the slot 52. This increased thickness dimension in the vicinity of the slot is provided in order to establish better support for the chamber as will be explained hereinafter with reference to FIGURE 4. A set screw 60 is provided through the wall 58 in order to lock the knife to the hollow cylinder. The roof member 51 should preferably be made of a corrosion resistant material such as stainless steel.

Figures 2, 3:
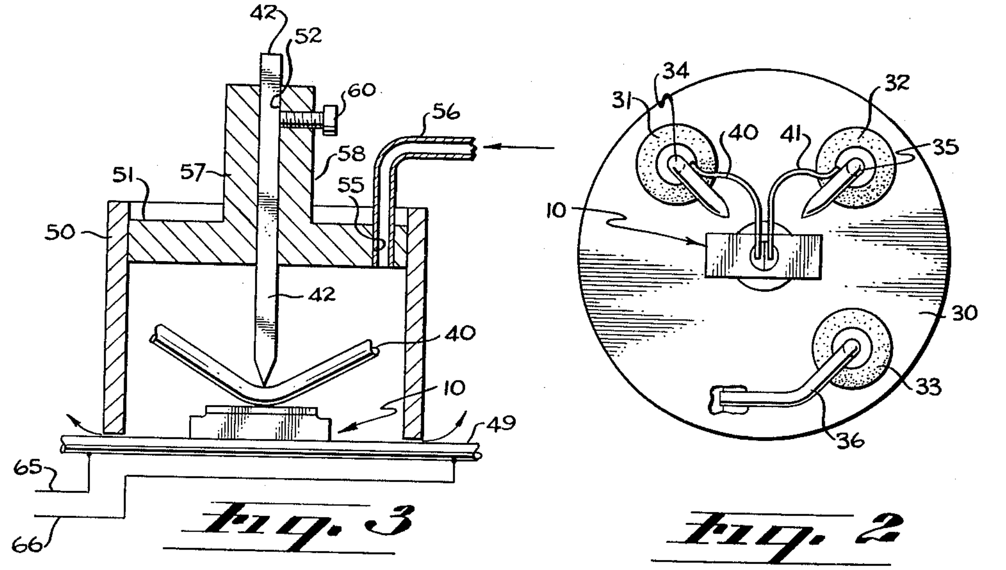
FIGURE 2 is a plan view of the transistor assembly upon completion of the present invention method.
FIGURE 3 is a sectional view of a part of an apparatus which may be used in order to carry out the present invention method.

The plate 49 upon which the assembly of FIGURE 3 rests is a tantalum strip heater which is connected to a source of electrical energy, not shown, through leads 65 and 66.

Figure 4:
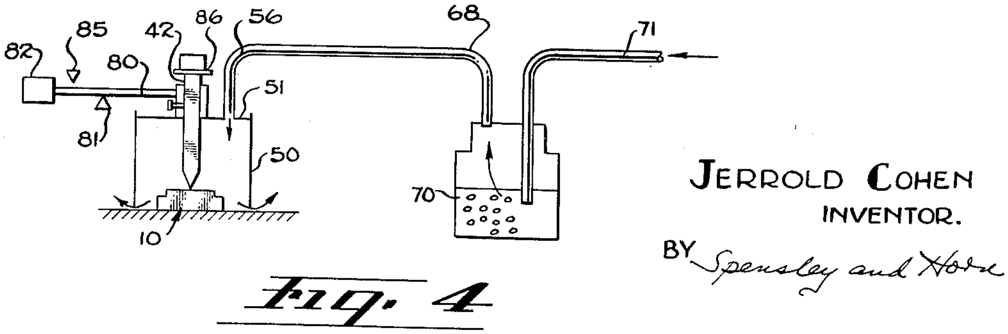
FIGURE 4 is a schematic view of a complete apparatus to carry out the present invention method.

A schematic view including the assembly of FIGURE 3 is shown in FIGURE 4 as an exemplary apparatus for carrying out the present invention method. Therein the gas inlet pipe 56 is shown to be connected to a gas outlet pipe 68 which is connected through a seal to a container 70 of hydrofluoric acid. An inlet pipe 71 is also inserted within the container 70.

In accordance with the present invention method after the transistor is placed upon the plate 49 with the wires 40 and 41 in place, the assembly of FIGURE 3 is placed thereover. The knife 42 is attached to extending lever 80 which lever is pivotally supported by a ball bearing at 81. Near the end of lever 80 opposite the knife is a counter-balance 82. A stop 85 is provided above the lever 80 to limit the downward movement of the knife. A platform 86 is provided atop the knife 42 to receive weights depending upon the pressure desired. Thus, the knife 42, which weighs approximately 1 gram is supported by the lever with the hollow cylinder being adapted to slide up and down upon the knife. The vertical position of the knife is determined relative to the silicon body and thereafter the chamber 50 is slid down with the knife 42 acting as a support for the chamber. The set screw 60 serves to allow the chamber to be suspended up high on the knife when the knife and the silicon body are being positioned. The position of the pivot 81 and therefore of the lever 80 and thus the knife 42 is determined by a micrometer adjustment not shown. The position of the stop 85 may similarly be adjusted. The pressure which the knife edge 42 exerts on the wire may be adjusted by placing a weight or weights 87 upon the knife 42. The roof 51 forms a gas tight seal with the side wall 50.

After the hollow cylinder is brought down over the plate 49 a source of an inert carrier gas, such as argon, is connected to the inlet pipe 71 in order to carry the vapor of HF from the container 70 through inlet pipe 56 to envelop the surface of the transistor 10 in HF vapor. The gas mixture (HF vapor, water vapor and argon) passes over the silicon transistor driving out any oxygen and removing the oxide film or other undesired surface film which may exist upon the surface where the bond is to be made. Further, the continued presence of the gas mixture precludes the formation of new surface films. The plate 49 is then brought up to and maintained at an elevated temperature of from 350° C. to 400° C. thus heating the silicon body to a temperature in the range from 320° C. to 360° C. The gold wires are thus compressed against the exposed silicon surface with the heat applied for approximately ten seconds to three minutes during which a superior thermo-compression bond is formed. The bonding operation may be carried on despite the fact that a very thin oxide film may be present as there may be some oxide in equilibrium. The thickness of such film is such that it presents no impediment to the bonding of the lead to the body.

The present invention method results in a strong thermo-compression bond to silicon at a relatively low temperature. Thus, during the bonding operation which is carried out in the herein designated atmosphere, impurities will not readily diffuse into the silicon and crystal dislocations will not result.

While HF has been designated as the reducing gas, any other reducing gas consisting essentially of a non-oxidizing compound of fluorine and which will remove silicon oxide as it is formed may be used; such gases include fluorine and "Freon" type chloro-fluoroalkanes such as $CCl_2F_2$, for example. Other surface films in addition to silicon oxides, such as boron oxide or phosphorus oxide, or the like, may also be present upon the surface of the silicon body, and these films should also preferably be removed or substantially removed in the area of the bond. The hereinabove designated reducing gases containing reactive fluorine will react with silicon dioxide or other surface films on silicon to produce the volatile compound of silicon (such as $SiF_4$ for example) without attacking the elemental silicon.

Any of the gases used may be dry or they may, as in the example herein described, be wet. The presence of the water vapor in the example discussed will result in the production of a thin oxide film and thus to a degree reduce the probability of producing a good bond. The water vapor is present due to the fact that the source of the hydrogen fluoride is hydrofluoric acid rather than a dry gas. This is used purely for safety reasons.

Additionally, it should be noted that an inert carrier gas such as argon is not necessary, although such has been found convenient for carrying out the present invention method. An inert gas need not necessarily be used as the carrier gas, in fact pure hydrogen fluoride may be used if such is necessary or convenient.

After completion of the bonding operation as hereinabove described, the transistor will appear as shown in cross-section in FIGURE 1. As may be seen in FIGURE 2, the free ends of the leads 40 and 41 are welded to terminal posts 34 and 35 respectively. The upper end of terminal post 36 is bent over and welded to the header 30. Thus, the completed package has its base region 12 connected to terminal post 34 through lead 40, emitter region 13 connected to terminal post 35 through lead 41 and collector region 11 connected directly to the header 30.

There has thus been described an improved method of bonding materials together in the absence of undesired contamination, especially oxygen, in the area of contact therebetween caused by exposure at contact area to the ambient. As has been stated hereinabove this improved method is particularly advantageous in bonding gold electrodes to a silicon semiconductor crystal body.

What is claimed as new is:

1. A method of thermo-compression bonding a gold-metal electrode to a silicon semiconductor crystal body including the steps of: placing the electrode in predetermined pressure contact with the semiconductor body; maintaining the contact area in a reducing atmosphere by introducing the vapors of hydrogen fluoride over the contact area; and heating said body to a temperature in the range from 320° C. to 360° C. for from ten seconds to three minutes.

2. A method of thermo-compression bonding a gold-metal electrode to a silicon semiconductor crystal body including the steps of: placing the electrode in predetermined pressure contact with the semiconductor body; maintaining the contact area in a reducing atmosphere by introducing a reducing gas consisting essentially of a nonoxidizing compound of fluorine which will react with silicon dioxide to produce a volatile compound of silicon without attacking elemental silicon over the contact area; and heating said body to a temperature in the range from 320° C. to 360° C. for from ten seconds to 3 minutes.

3. A method of thermo-compression bonding a gold-metal electrode to a silicon semiconductor crystal body including the steps of: placing the electrode in predetermined pressure contact with the semiconductor body; maintaining the contact area in a reducing atmosphere by introducing a reducing gas consisting essentially of a non-oxidizing compound of fluorine which will react with silicon dioxide to produce a volatile compound of silicon without attacking elemental silicon carried by an inert gas over the contact area; and heating said body to a temperature in the range from 320° C. to 360° C. for from ten seconds to three minutes.

References Cited in the file of this patent

UNITED STATES PATENTS

| | | |
|---|---|---|
| 2,421,649 | Priest et al. | June 3, 1947 |
| 2,585,819 | Moore et al. | Feb. 12, 1952 |
| 2,642,656 | Grosse | June 23, 1953 |
| 2,757,324 | Pearson | July 31, 1956 |
| 2,763,822 | Frola et al. | Sept. 18, 1956 |
| 2,801,375 | Losco | July 30, 1957 |
| 2,807,561 | Nelson | Sept. 24, 1957 |
| 3,002,864 | Van Amstel | Oct. 3, 1961 |

OTHER REFERENCES

Bell Laboratories Record, April 1958, pages 127–130.